(12) United States Patent
Chhabra et al.

(10) Patent No.: US 10,839,865 B1
(45) Date of Patent: Nov. 17, 2020

(54) SELF-TIMED MEMORY WITH ADAPTIVE VOLTAGE SCALING

(71) Applicant: Arm Limited, Cambridge (GB)

(72) Inventors: Amit Chhabra, Noida (IN); Saikat Kumar Banik, Noida (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/397,677

(22) Filed: Apr. 29, 2019

(51) Int. Cl.
  *G11C 5/14* (2006.01)
  *G11C 11/417* (2006.01)
  *G11C 11/413* (2006.01)

(52) U.S. Cl.
  CPC ............ *G11C 5/147* (2013.01); *G11C 11/413* (2013.01); *G11C 11/417* (2013.01)

(58) Field of Classification Search
  CPC ..... G11C 5/147; G11C 11/417; G11C 11/413; G11C 5/14
  See application file for complete search history.

(56) References Cited

U.S. PATENT DOCUMENTS

| | | | | |
|---|---|---|---|---|
| 9,430,598 | B2* | 8/2016 | Fish | G06F 30/00 |
| 9,786,356 | B2* | 10/2017 | Wang | G11C 11/417 |
| 2007/0096775 | A1* | 5/2007 | Elgebaly | G06F 1/3296 327/105 |
| 2009/0108899 | A1* | 4/2009 | Bhatia | G11C 7/08 327/261 |
| 2010/0085823 | A1* | 4/2010 | Carpenter | G11C 7/22 365/194 |
| 2010/0115475 | A1* | 5/2010 | Buonpane | G06F 30/36 716/132 |
| 2013/0311799 | A1* | 11/2013 | Fitzpatrick | G06F 1/3296 713/320 |
| 2015/0171738 | A1* | 6/2015 | Tanabe | G06F 1/28 307/24 |

* cited by examiner

*Primary Examiner* — Mushfique Siddique
(74) *Attorney, Agent, or Firm* — Pramudji Law Group PLLC; Ari Pramudji

(57) ABSTRACT

Various implementations described herein are directed to an integrated circuit that has memory circuitry with a memory structure and a reference path. The integrated circuit includes performance sensing circuitry having a logic structure that is adapted to detect variation of performance of the memory structure. The integrated circuit includes power management circuitry that is coupled to the memory circuitry and the performance sensing circuitry. The power management circuitry receives a feedback signal from the performance sensing circuitry and adaptively adjusts voltage provided to the memory circuitry based on the feedback signal to affect performance of the memory structure. The memory circuitry has a logic stage that reduces signal delay in the reference path for alignment with the adaptively adjusted voltage.

20 Claims, 8 Drawing Sheets

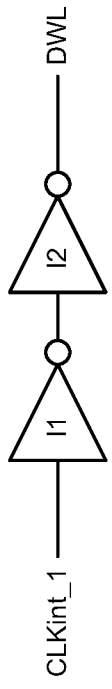
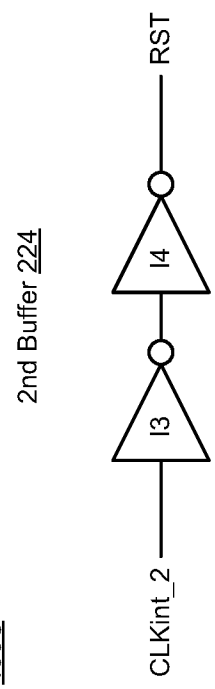
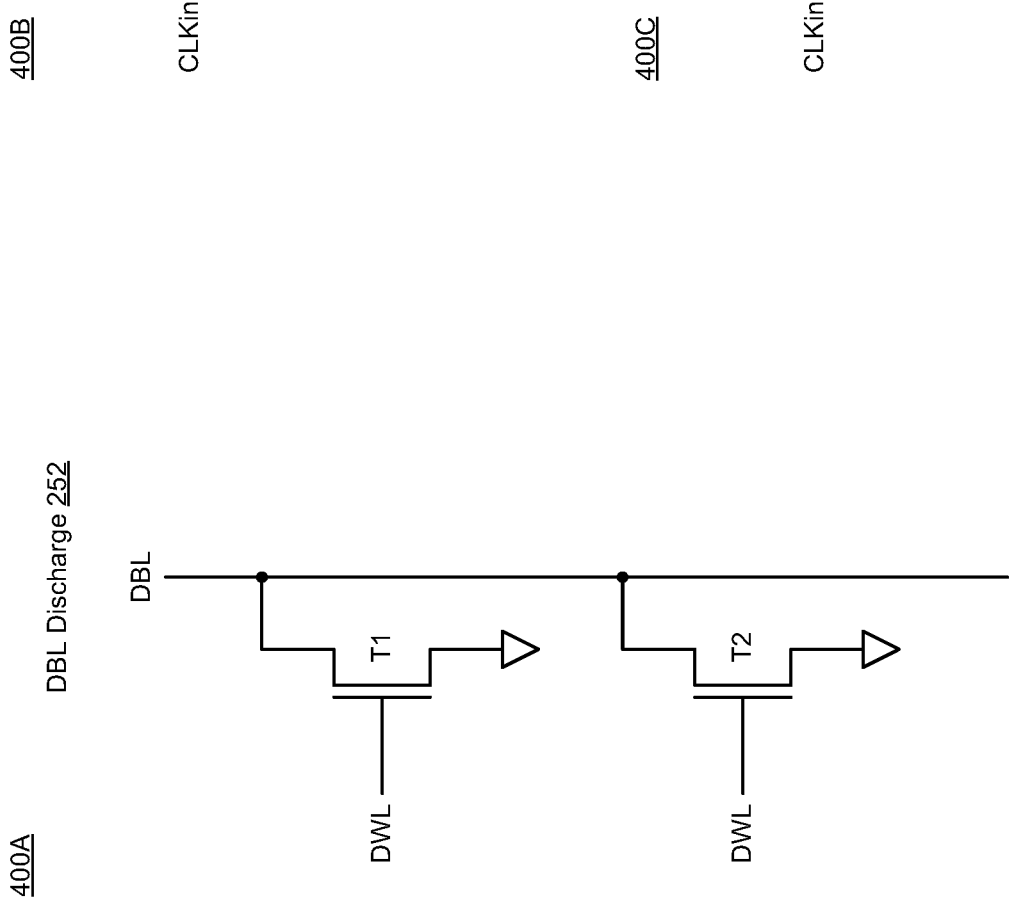
FIG. 4B
FIG. 4C
FIG. 4A

600

610 — sensing operational characteristics of a logic structure that is adapted for detecting variation of performance of a memory structure having a reference path 620 — managing power distribution to the logic structure and to the memory structure by receiving a feedback signal from the logic structure and by using adaptive voltage scaling to adaptively adjust voltage provided to the memory circuitry based on the feedback signal to affect performance of the memory structure 630 — implementing a logic stage in the memory structure to reduce signal delay in the reference path for alignment with the adaptive voltage scaling

FIG. 6

SELF-TIMED MEMORY WITH ADAPTIVE VOLTAGE SCALING

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

The performance of a system-on-a-chip (SoC) may be limited by process variation resulting in higher transistor delays and/or higher interconnect delays at extreme temperature conditions (at low temperatures, e.g., −40° C., or high temperatures, e.g., 125° C.). Generally, lowest voltage for performance sign-off may be below typical supply voltages combined with worst-case temperature and process variation. Thus, timing closure at a slowest point, which may occur infrequently and for few semiconductor dies, may limit the ability to reduce power consumption of some electronic systems and/or various devices associated therewith.

BRIEF DESCRIPTION OF THE DRAWINGS

Implementations of various metal layout techniques are described herein with reference to the accompanying drawings. It should be understood, however, that the accompanying drawings illustrate only various implementations described herein and are not meant to limit embodiments of various techniques described herein.

FIGS. 4A-4C illustrate diagrams of various modified logic stages in accordance with various implementations described herein.

FIG. 6 illustrates a process flow diagram of a method for managing performance of memory in accordance with various implementations described herein.

DETAILED DESCRIPTION

Various implementations described herein are directed to various schemes and techniques for providing self-timed memory circuitry with adaptive voltage scaling (AVS). For instance, various schemes and techniques described herein provide for an AVS methodology to manage performance behavior and characteristics associated with memory circuitry using performance sensing circuitry adapted to provide feedback for power management based on detected variation of performance of the memory circuitry. In some instances, performance of the memory circuitry may be based on one or more operating conditions associated with detected variation of at least one of process, voltage and temperature (PVT) of the memory circuitry and various components related thereto.

Various implementations of providing power managing schemes and techniques for self-timed memory circuitry with adaptive voltage scaling (AVS) will now be described in greater detail herein with reference to FIGS. 1-7.

Figure 1:
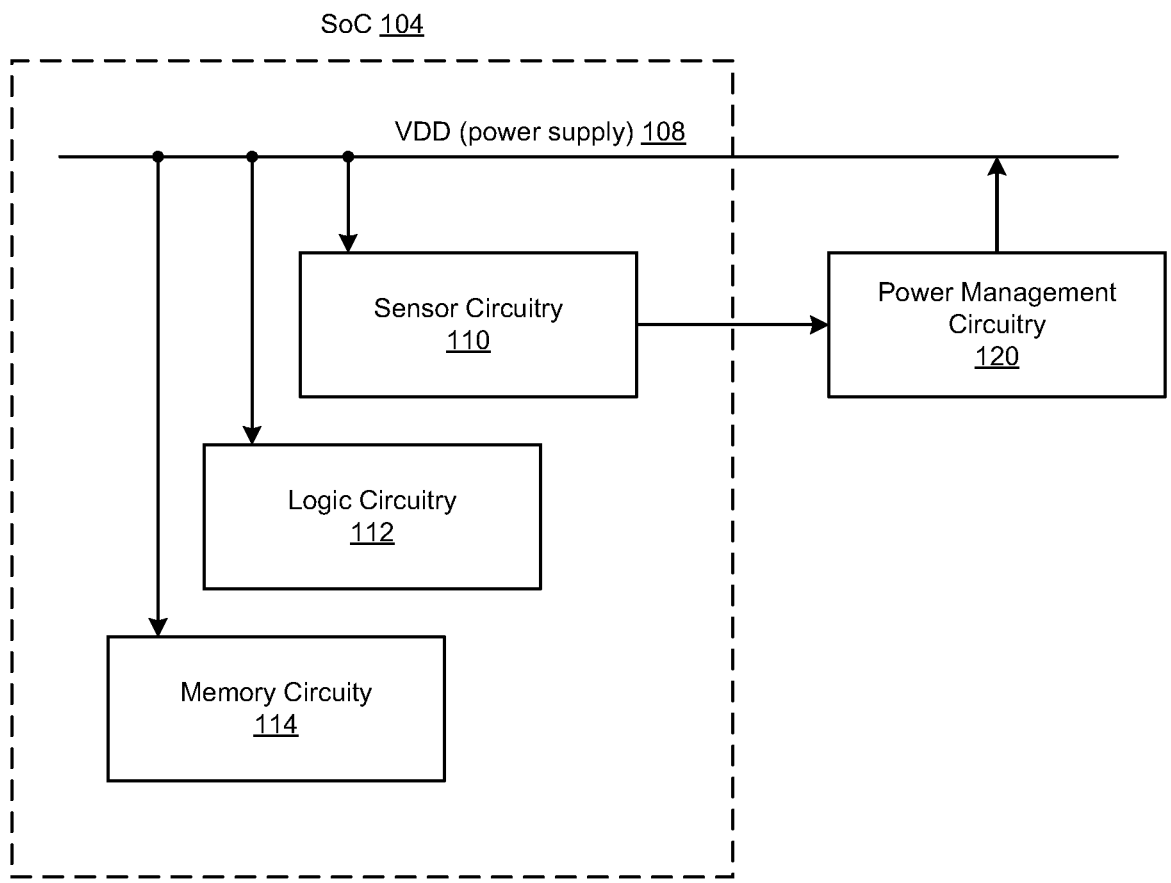
FIG. 1 illustrates a schematic diagram of circuitry having sensor circuitry and memory circuitry along with power management circuitry in accordance with implementations described herein.

FIG. 1 illustrates a schematic diagram of circuitry 100 having sensor circuitry 110 and memory circuitry 114 along with power management circuitry 120 in accordance with various implementations described herein. The circuitry 100 may include system-on-a-chip (SoC) circuitry 104 with the sensor circuitry 110, logic circuitry 112 and the memory circuitry 114 along with the power management circuitry 120. In some implementations, as described herein, the memory circuitry 114 and the sensor circuitry 110 (which may also be referred to as performance sensing circuitry) may be fabricated on a single chip.

As shown in FIG. 1, the circuitry 100 includes the memory circuitry 114 having a memory structure (e.g., bitcells and related logic circuitry) with one or more reference paths (e.g., signal paths between internal components). As described herein, performance of the memory structure is based on one or more operating conditions associated with a detected variation of at least one of process, voltage and temperature (PVT) of the memory structure. Also, in some implementations, the memory circuitry 100 may be self-timed memory circuitry having adaptive voltage scaling (AVS) capability and/or characteristics.

The circuitry 100 may include the sensor circuitry 110 which may be implemented as performance sensing circuitry having a logic structure that is adapted to detect variation of performance of the memory structure. The logic structure may provide the feedback signal to the power management circuitry 120 based on the detected variation of performance of the memory structure in the memory circuitry 114.

The logic circuitry 112 may include control logic circuitry that is used to interface with row control logic (e.g., row decoders having wordline drivers) and column control logic (e.g., column decoders having bitline drivers) for access to bitcells (or memory cells) in the memory circuitry 114. The control logic circuitry may also include dummy wordline (DWL) control logic and dummy bitline (DBL) control logic that are used to assist with accessing the bitcells (or memory cells) in the memory circuitry 114. The logic circuitry 112 is described in greater detail herein in reference to FIG. 2.

The circuitry 100 may include the power management circuitry 120 that is coupled to the sensor circuitry 110 (or performance sensing circuitry) and the memory circuitry 114 via power supply line (or VDD bus) 108. The power management circuitry 120 may receive a feedback signal from the sensor circuitry 110 (or performance sensing circuitry) and use adaptive voltage scaling (AVS) to adaptively adjust voltage (VDD) provided to the memory circuitry 114 based on the feedback signal to affect performance of the memory structure.

As described in greater detail herein, the memory circuitry 114 may include one or more logic stages that may be used to reduce signal delay in the reference path for alignment with the adaptive voltage scaling (AVS). As shown in FIG. 1, the memory structure of the memory circuitry 114 may be disposed in a first area of the SoC circuitry 104, and the logic structure of the sensor circuitry 110 may be disposed in a second area of the SoC circuitry 104 that is different (and separate) than the first area. Also, the memory structure may be referred to as a first memory structure having first memory cells, and the logic structure may be a second memory structure having second memory cells that are separate from the first memory cells. In some implementations, the first memory structure and the second memory structure are formed (or fabricated) at the same time. Also, in various implementations, the memory circuitry 114 may include self-timed static random access memory (SRAM), and the memory structure may include an array of SRAM bitcells. Further scope associated with the memory circuitry 114 is described in greater detail herein in reference to FIG. 2.

The circuitry 100 and the SoC circuitry 104 including various components thereof may be fabricated and implemented as an integrated circuit (IC), and thus, the circuitry 100 and the SoC circuitry 104 may be integrated with various types of computing circuitry and related components on a single chip. Also, the circuitry 100 and the SoC circuitry 104 may be implemented in many embedded systems for various types of electronic, mobile, Internet-of-Things (IoT) and/or biometric applications.

Figure 2:
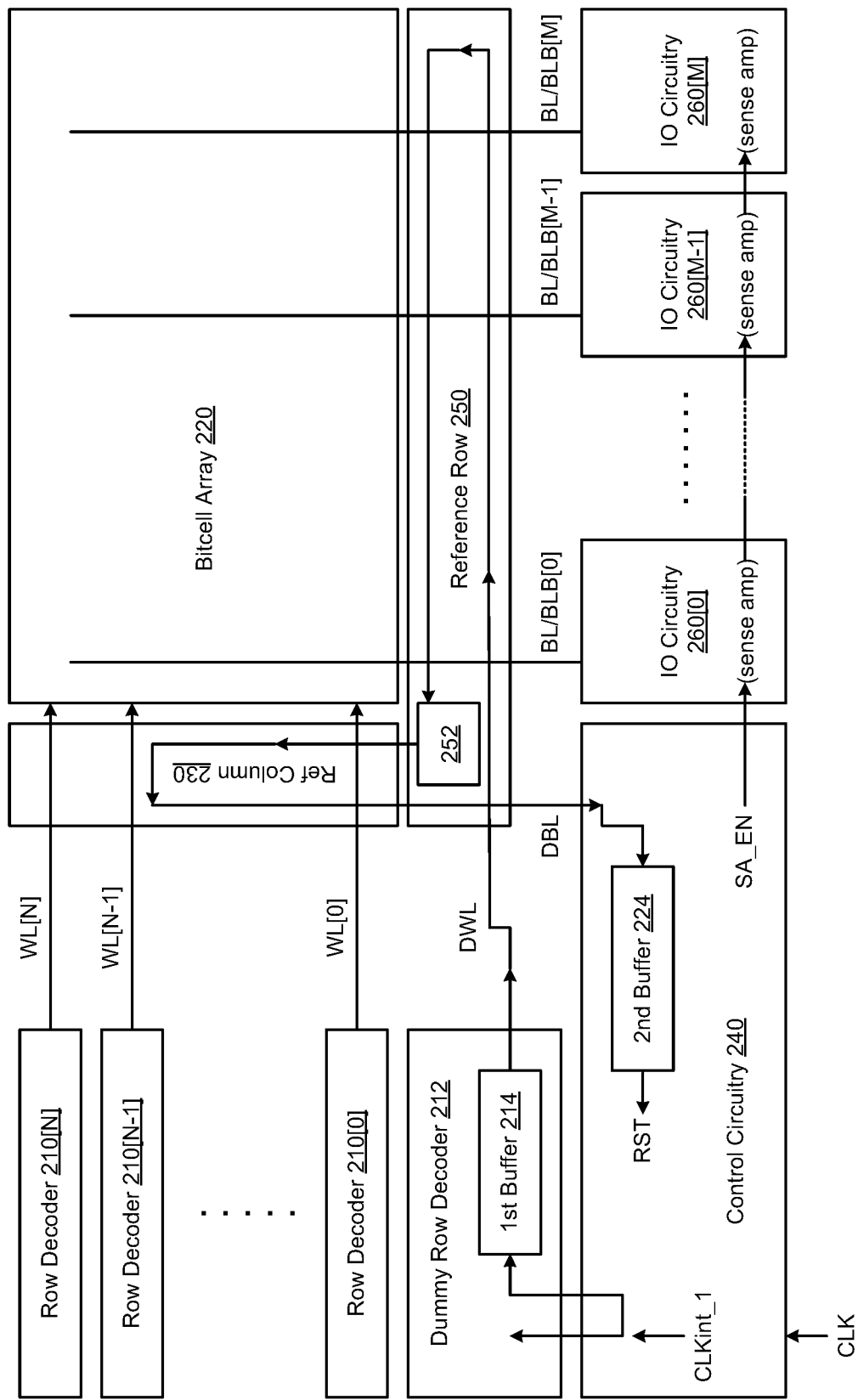
FIG. 2 illustrates a schematic diagram of memory circuitry in accordance with various implementations described herein.

FIG. 2 illustrates a diagram of memory circuitry 200 in accordance with various implementations described herein. The memory circuitry 200 of FIG. 2 may be utilized as the memory circuitry 114 of FIG. 1. Also, in some implementations, the memory circuitry 200 may be self-timed memory circuitry having AVS capability and/or characteristics.

As shown in FIG. 2, the memory circuitry 200 includes various circuitry including row decoder circuitry 210[0], . . . , 210[N−1], 210[N], dummy row decoder circuitry 212, a bitcell array 220, and reference column circuitry 230. In addition, the memory circuitry 200 includes control circuitry 240, input/output (IO) circuitry 260[0], . . . , 260[M−1], 260[M], and reference row circuitry 250. The IO circuitry 260[0], . . . , 260[M−1], 260[M] may be referred to as column decoder circuitry. The bitcell array 220 includes multiple bitcells (or memory cells) arranged in columns and rows, wherein each of the bitcells is accessible via a selected wordline and a selected bitline. The row decoders 210[0], . . . , 210[N−1], 210[N] include wordline drivers that are coupled to the rows of bitcells via corresponding wordlines WL[0], . . . , W[N−1], W[N]. The IO circuitry 260[0], . . . , 260[M−1], 260[M] includes sense amplifiers that are coupled to columns of bitcells via corresponding complementary bitlines BL/BLB[0], . . . , BL/BLB[M−1], BL/BLB[M]. The wordlines WL[0], . . . , W[N−1], W[N] and the bitlines BL/BLB[0], . . . , BL/BLB[M−1], BL/BLB[M] provide access to each bitcell in the bitcell array 220 based on a selected wordline and a selected bitline. Also, in some instances, the dummy row decoder circuitry 212 includes one or more dummy wordline (DWL) drivers (e.g., first buffer 214) that are used to drive a dummy wordline signal via a dummy wordline (DWL). In some instances, the first buffer 214 may be implemented and used as a first logic stage that reduces signal delay in a reference path (e.g., reference row loop passing through the reference row circuitry 250) for alignment with the adaptive voltage scaling (AVS). In some instances, the first buffer 214 may be referred to as first buffer circuitry having one or more buffers arranged (e.g., in series) to provide delay to the reference path, such as, e.g., the reference row path 250.

The control circuitry 240 may receive a clock signal CLK and provide an internal clock signal (e.g., a first internal clock signal CLKint_1) to the dummy row decoder circuitry 212. In some instances, the dummy row decoder circuitry 212 includes first buffer 214 that receives the first internal clock signal CLKint_1 and provides a buffered first internal clock signal CLKint_1 to the reference row circuitry 250 via a dummy wordline (DWL). As shown, the first internal clock signal CLKint_1 passes through the reference row circuitry 250 to a DBL discharge device 252 via a reference path loop of the dummy wordline (DWL).

In some instances, the control circuitry 240 may receive a DBL discharge signal from the DBL discharge device 252 during discharge of the dummy bitline (DBL). In some instances, the control circuitry 240 may include the second buffer 224 that receives the DBL discharge signal and provides a reset signal (RST) as feedback to the control circuitry 240. As shown, the DBL discharge signal passes through the column row circuitry 230 to second buffer 224 via a reference path loop of the dummy bitline (DBL). The second buffer 224 may be implemented and used as a second logic stage that reduces signal delay in a reference path (e.g., reference row loop passing through the reference column circuitry 230) for alignment with the adaptive voltage scaling (AVS). In some implementations, the control circuitry 240 may also receive the clock signal CLK and provide a sense amplifier enable signal (SA_EN) to the sense amplifiers of the IO circuitry 260[0], . . . , 260[M−1], 260[M]. The second buffer 224 may be referred to as second buffer circuitry having one or more buffers arranged (e.g., in series) to provide delay to the reference path, such as, e.g., the reference column path 230. In some instances, the DBL discharge device 252 may include an NMOS transistor having its gate coupled to the dummy wordline (DWL) and its drain coupled to the dummy bitline (DBL). Also, as shown, the DBL loops through the column reference path of the column circuitry 230 to the second buffer 224. Further discussion related to the DBL discharge device 252 is provided herein below in reference to FIG. 5B.

In some implementations, the memory circuitry 200 includes the bitcell array 220 as a memory structure with one or more reference paths, such as, e.g., the reference column path 230 and the reference row path 250. As described herein, the memory circuitry 200 has one or more logic stages (e.g., first buffer 214 and/or second buffer 224) that reduce signal delay in the one or more reference paths 230, 250 for alignment with the adaptive voltage scaling (AVS). In some instances, the one or more logic stages (e.g., 214, 224) may include one or more modified logic stages that are coupled to one or more corresponding reference paths (e.g., 230, 250). For instance, the modified logic stage (e.g., 214, 224) may reduce a number of stages in a buffer coupled between the dummy bitline (DBL) and the reset signal (RST) that is associated with the memory structure (e.g., the bitcell array 220). The modified logic stage (e.g., 214, 224) may increase strength of transistors that are used for discharging the dummy bitline (DBL) associated with the memory structure (e.g., 220). Also, the modified logic stage (e.g., 214, 224) may reduce delay between one or more of clock signals (e.g., CLKint_1, CLKint_2) and the DWL and/or the DBL associated with the memory structure (e.g., 220), and/or the modified logic stage (e.g., 214, 224) may reduce a length of the dummy wordline path (DWL path) associated with the memory structure (e.g., 220).

In some implementations, each bitcell in the bitcell array 220 may also be referred to as a memory cell, and each bitcell may be configured to store at least one data bit value (e.g., a data value associated with logical '0' or '1'). Each row of bitcells in the bitcell array 220 may include any number of bitcells arranged in various configurations, such as, e.g., a two-dimensional (2D) memory array having columns and rows of multiple bitcells arranged in a 2D grid pattern. Each bitcell may be implemented with random access memory (RAM) circuitry, or some other type of volatile memory. For instance, each bitcell (or memory cell) may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit.

Generally, there are multiple types of memory structures: one-wordline devices (i.e., single port) and multi-wordline devices (i.e., multi-port memory, such as, e.g., dual port memory). One-wordline devices (e.g., ROM, RAM, DRAM, SRAM, etc.) may refer to devices having only one access port, which may be referred to as access devices. The bitlines may utilize single rail or dual rail architecture. The transistor types (e.g., N-type MOS and P-type MOS) may be referred to as access transistors. In some scenarios, the high-density SRAM bitcells that are implemented with minimally sized transistors may limit Vmin of a design. However, in FinFET technology, device sizing quantization remains a challenge for compact 6T SRAM bitcells with minimum-size transistors. As such, in some implementations, careful optimization of design memory assist circuits may be used to deliver low power memory operation. In addition, each bitcell in the bitcell array 220 may be accessed with a selected wordline WL and complementary bitlines BL, NBL.

Generally, static RAM bitcells may include 6T bitcells, which may have access ports controlled by wordlines (WLs). In various implementations, static RAM bitcells may be implemented with a 5T bitcell, 4T 2R bitcell, or various other types of CMOS SRAM cells, such as, e.g., 8T, 10T or more transistors per bit. Also, multi-wordlines may result in multiple access ports into each of the bitcells. Since there are multiple access ports, the multi-ports access devices may be varied within each bitcell so that some access devices (by port) are NFETs and some access devices by port are PFETs. Although these may be effectively varied within each single bitcell, their number of ports may not be easily divided into equal capacitance and/or power. Thus, although these multi-ports transistor types may vary within each bitcell, there may also be a need to have a variation between arrays as in, e.g., a left-half array and a right-half array.

The memory circuitry 200 including each bitcell in the bitcell array 220 may be implemented as an integrated circuit (IC) with various types of memory circuitry, such as, e.g., random access memory (RAM), and/or any other types of memory, including any type of volatile memory and non-volatile memory. The memory circuitry 200 may be implemented as an IC with single and/or dual rail memory architectures. The memory circuitry 200 may also be integrated with computing circuitry and related components on a single chip. Further, the memory circuitry 200 may be implemented in an embedded system for various types of electronic, mobile, Internet-of-Things (IoT) and/or biometric applications.

Figure 3:
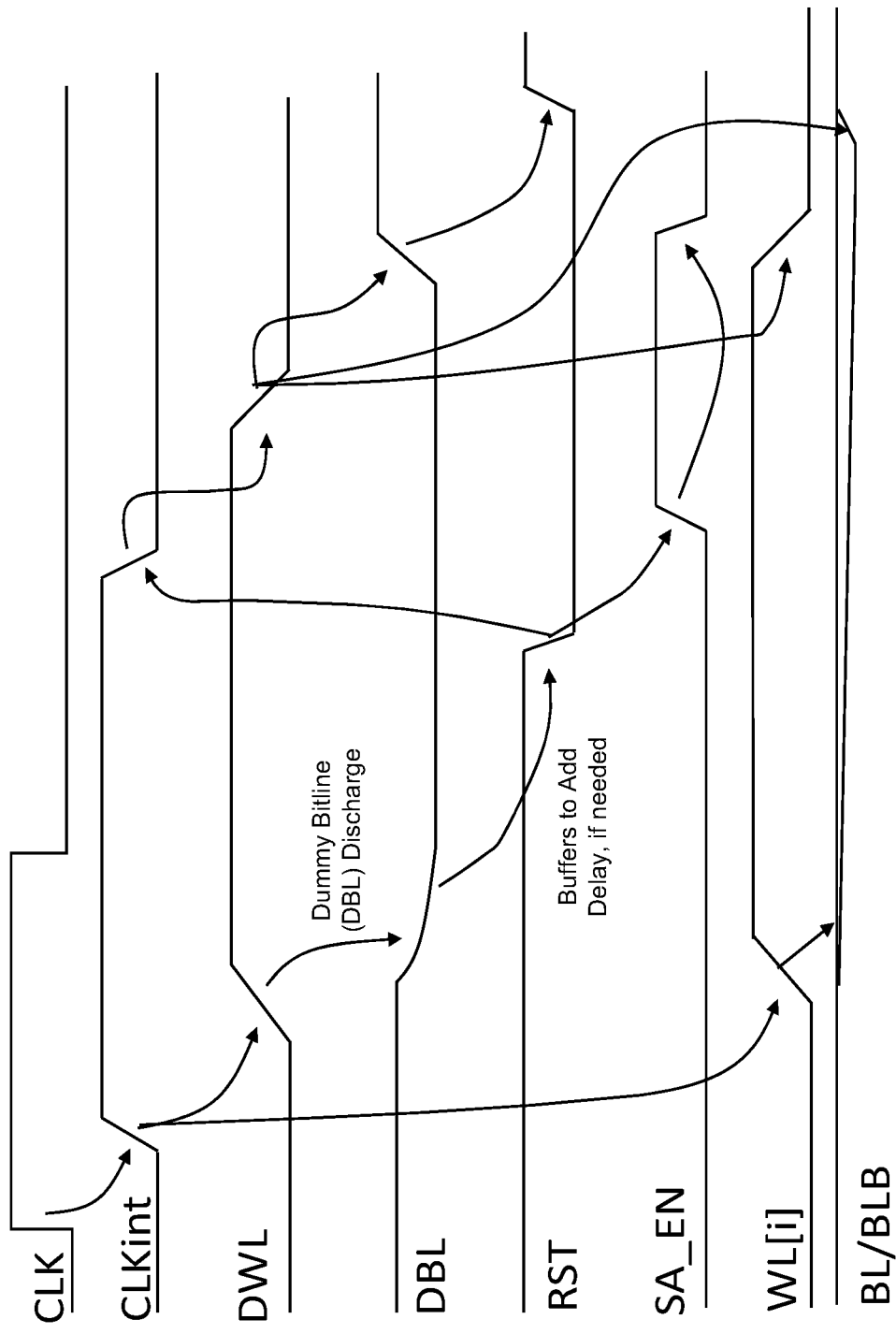
FIG. 3 illustrates a waveform diagram of various signals used by the circuitry in accordance with various implementations described herein.

FIG. 3 illustrates a waveform diagram 300 of various signals used by the circuitry 100, 200 in accordance with various implementations described herein. For instance, the control circuitry 240 of FIG. 2 may be used to control signal flow associated with the various circuit components in the memory circuitry 200 of FIG. 2.

In some implementations, the control circuitry 240 receives the clock signal (CLK) and then provides the internal clock signal (CLKint, such as, e.g., CLKint_1). As shown in FIG. 3, the rising edge of the clock signal (CLK) may be used to trigger generation of the internal clock signal (CLKint), and the rising edge of the internal clock signal (CLKint) may then trigger multiple signals. For instance, the rising edge of the internal clock signal (CLKint) may trigger the dummy wordline (DWL) signal and/or the wordline signal (WL[i]). The rising edge of the wordline signal (WL[i]) may trigger the falling edge of the complementary bitline signals (BL/BLB[i]). Also, the rising edge of the dummy wordline (DWL) may trigger the falling edge of the dummy bitline (DBL), which may refer to discharge of the dummy bitline (DBL). Also, the falling edge of the dummy bitline (DBL) may trigger the falling edge of the reset signal (RST). In some instances, as described herein, in reference to triggering the falling edge of the reset signal (RST), one or more buffers may be added to the reference path to increase the delay, if needed.

Then, in some instances, the falling edge of the reset signal (RST) may trigger the falling edge of the internal clock signal (CLKint), and also, the falling edge of the reset signal (RST) may trigger the rising edge of the sense amplifier enable signal (SA_EN). In addition, the sense amplifier enable signal (SA_EN) may refer to a pulse having a particular interval, and in this instance, the falling edge of the sense amplifier enable signal (SA_EN) may then be provided after the particular interval.

Further, the falling edge of the internal clock signal (CLKint) may trigger the falling edge of the dummy wordline signal (DWL). In this instance, the falling edge of the dummy wordline signal (DWL) may trigger the rising edge of the dummy bitline signal (DBL), the falling edge of the wordline signal (WL[i]), and the rising edge of the complementary bitline signals (BL/BLB). Then, in some instances, the rising edge of the dummy bitline signal (DBL) may trigger the rising edge of the reset signal (RST).

FIGS. 4A-4C illustrate diagrams of various modified logic stages in accordance with various implementations described herein. In particular, FIG. 4A illustrates a diagram of a first modified logic stage 400A in reference to the dummy bitline discharge circuitry 252 in FIG. 2, FIG. 4B illustrates a diagram of a second modified logic stage 400B in reference to the first buffer circuitry 214 in FIG. 2, and also, FIG. 4C illustrates a diagram of a third modified logic stage 400C in reference to the second buffer circuitry 224 in FIG. 2.

As shown in FIG. 4A, the first modified logic stage 400A is provided in reference to the dummy bitline (DBL) discharge circuitry 252 in FIG. 2. As described herein above, the logic stage of the memory circuitry 200 may be implemented as a modified logic stage that is coupled to a reference path, such as, e.g., the reference row path 250. For instance, the modified logic stage may increase the strength of one or more transistors (e.g., T1, T2) that are used for discharging a dummy bitline (DBL) associated with the memory structure. In this instance, as shown, the transistors (T1, T2) may be coupled in parallel between the dummy bitline (DBL) and ground (e.g., Vss or Gnd). Also, the dummy wordline signal (DWL) may be coupled to gates of the transistors (T1, T2) and used to activate the transistors (T1, T2). In some instances, as shown in FIG. 4A, the transistors (T1, T2) may include N-type transistors, such as, e.g., N-type metal-oxide-semiconductor (NMOS) transistors. However, in other instances, P-type transistors (e.g., PMOS transistors) may be used, and the P-type transistors may be coupled between the DBL and voltage supply Vdd.

As shown in FIG. 4B, the second modified logic stage 400B may be provided in reference to the first buffer circuitry 214 in FIG. 2. As described herein above, the logic stage of the memory circuitry 200 may be implemented as a modified logic stage that is coupled to a reference path, such as, e.g., the reference row path 250. In some instances, the modified logic stage may be used to reduce delay between a clock signal (e.g., CLKint_1) and the dummy wordline (DWL) that is associated with the memory structure. Also, in other instances, the modified logic stage may be used to reduce a length of the dummy wordline (DWL) path (e.g., the looped path through the reference row circuitry 250) associated with the memory structure. As shown in FIG. 4B, the modified first buffer stage 214 may include multiple inverters (I1, I2) that are arranged (e.g., coupled in series) to receive the first internal clock signal (CLKint_1) and provide the buffered first internal clock signal to the DWL.

As shown in FIG. 4C, the third modified logic stage 400C may be provided in reference to the second buffer circuitry 224 in FIG. 2. As described herein above, the logic stage of the memory circuitry 200 may be implemented as a modified logic stage that is coupled to a reference path, such as, e.g., the reference column path 230. For instance, the modified logic stage may be used to reduce delay between a clock signal (e.g., CLKint_2) and the dummy bitline (DBL) that is associated with the memory structure. In other instances, the modified logic stage may be used to reduce a number of stages in the buffer (e.g., 224) that is coupled between the dummy bitline (DBL) and the reset signal (RST) via the reference path (e.g., the looped path through the reference column circuitry 230) that is associated with the memory structure. As shown in FIG. 4C, the modified second buffer stage 224 may include multiple inverters (I3, I4) that are arranged (e.g., coupled in series) to receive the second internal clock signal (CLKint_2) and provide the buffered second internal clock signal as the reset signal (RST).

Figure 5A:
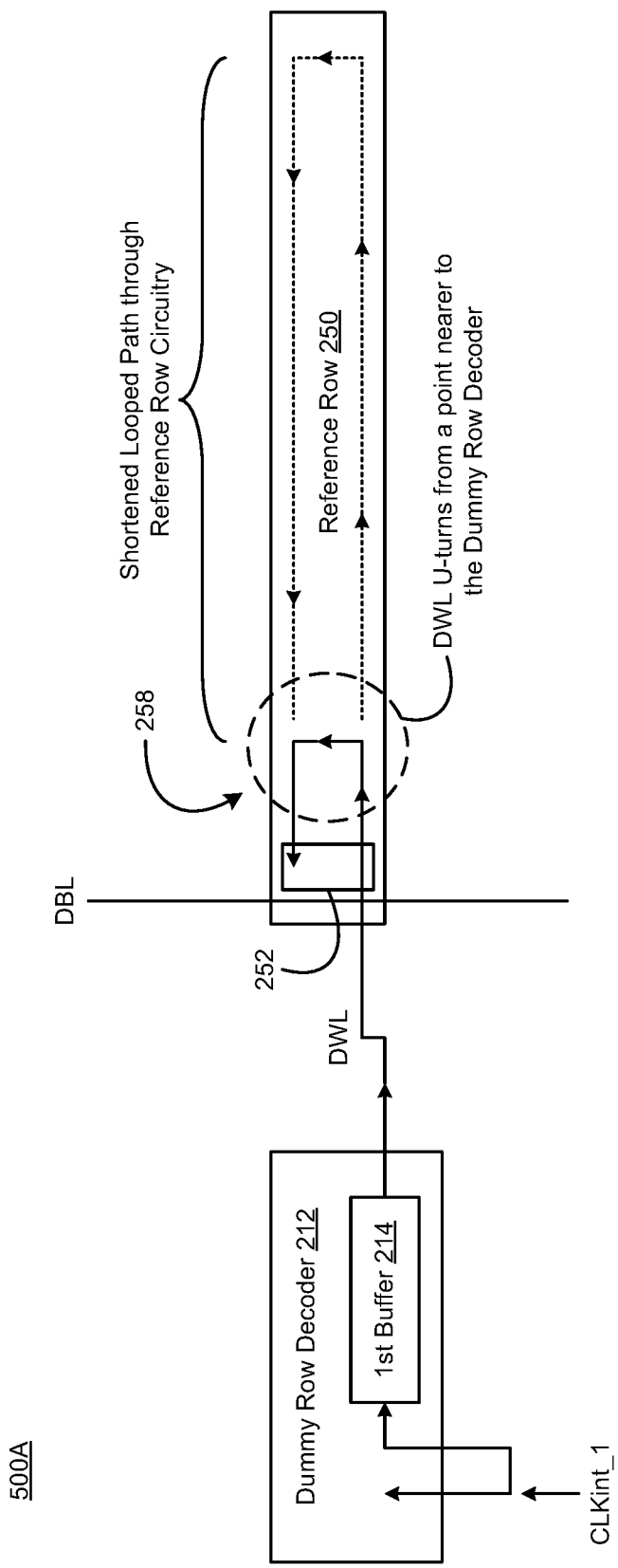
FIG. 5A illustrates a diagram of dummy wordline (DWL) circuitry coupled to a shortened reference row path in accordance with implementations described herein.

FIG. 5A illustrates a diagram 500A of dummy row circuitry 212 that is coupled to a shortened reference row path 250 in accordance with various implementations described herein. As shown in FIG. 5A, the modified logic stage of the first buffer circuitry 214 may be used to reduce delay between the first internal clock signal (CLKint_1) and the dummy wordline (DWL) that is associated with the memory structure. In some instances, the modified logic stage may refer to reducing a length of the dummy wordline (DWL) path (e.g., by shortening the looped path through the reference row circuitry 250) that is associated with the memory structure. For instance, as shown in FIG. 5A, the DWL U-turns from a point nearer (or closer) to the dummy row decoder 212 so as to thereby have a shortened looped path 258 through the reference row circuitry 250.

Figure 5B:
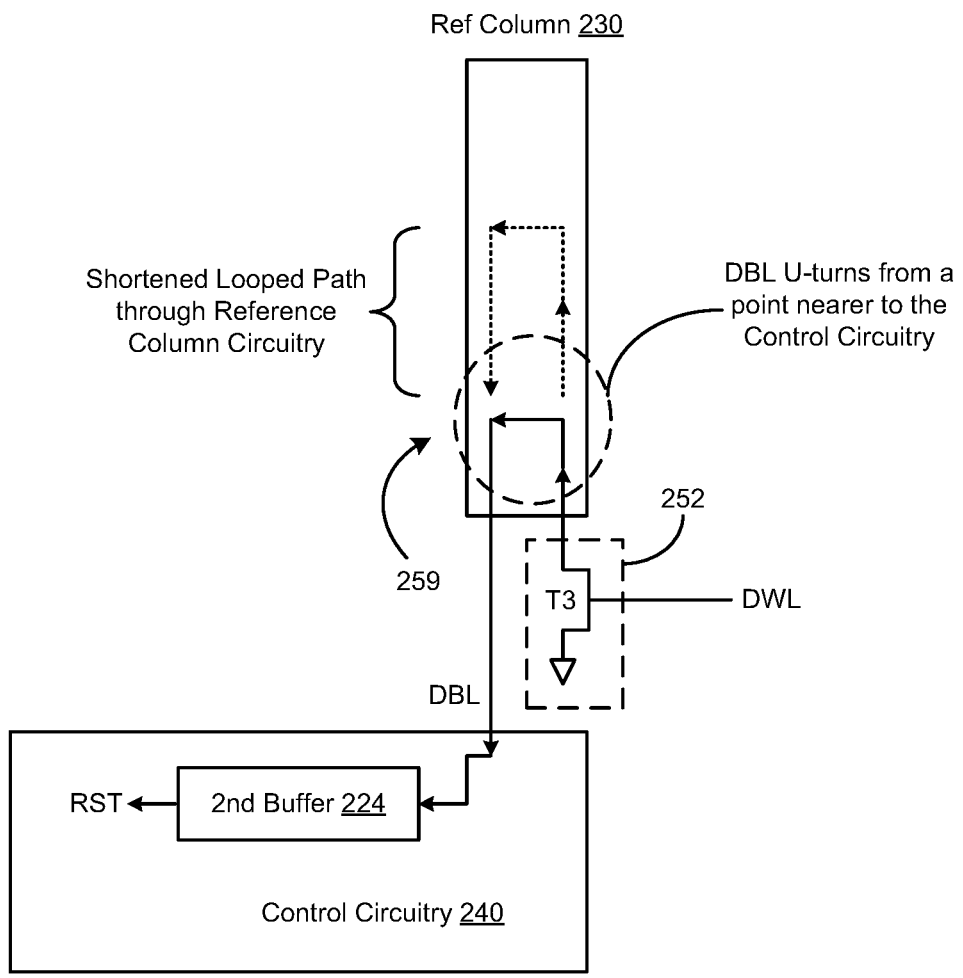
FIG. 5B illustrates a diagram of dummy bitline (DBL) circuitry coupled to a shortened reference column path in accordance with implementations described herein.

FIG. 5B illustrates a diagram 500B of control circuitry 240 that is coupled to a shortened reference column path 230 in accordance with various implementations described herein. As shown in FIG. 5B, the modified logic stage of the second buffer circuitry 224 may be used to reduce delay between the DBL discharge signal from the DBL discharge device 252 and the dummy bitline (DBL) that is associated with the memory structure. In some instances, the modified logic stage may refer to reducing a length of the dummy bitline (DBL) path (e.g., by shortening the looped path through the reference column circuitry 230) that is associated with the memory structure. For instance, as shown in FIG. 5B, the DBL U-turns from a point nearer (or closer) to the control circuitry 240 so as to thereby have a shortened looped path 259 through the reference column circuitry 230. In some instances, the DBL discharge device 252 may include an NMOS transistor (T3) having its gate coupled to the dummy wordline (DWL), its drain coupled to the dummy bitline (DBL), and its source coupled to ground (GND or VSS). As shown, the NMOS transistor (T3) of the DBL discharge device 252 is activated by a DWL signal via the dummy wordline (DWL). In other instances, the DBL discharge device 252 may include use of a PMOS transistor.

FIG. 6 illustrates a process diagram of a method 600 for managing performance of memory in accordance with various implementations described herein.

It should be understood that even though method 600 indicates a particular order of operation execution, in some cases, various certain portions of the operations may be executed in a different order, and on different systems. In other cases, additional operations and/or steps may be added to and/or omitted from method 600. Also, method 600 may be implemented in hardware and/or software. If implemented in hardware, the method 600 may be implemented with various components and/or circuitry, as described herein in reference to FIGS. 1-5. Also, if implemented in software, method 600 may be implemented as a program or software instruction process configured for managing performance of memory circuitry, as described herein. Further, if implemented in software, the instructions related to implementing the method 600 may be stored in memory and/or a database. For instance, a computer or various other types of computing devices having at least one processor and memory may be configured to perform method 600.

As described and shown in reference to FIG. 6, method 600 may be utilized for fabricating and/or manufacturing, or causing to be fabricated and/or manufactured, an integrated circuit (IC) that implements various memory performance managing schemes and techniques as described herein that are related to providing performance sensing circuitry and/or various associated devices, components and circuits.

At block 610, method 600 may sense operational characteristics of a logic structure that is adapted for detecting variation of performance of a memory structure (e.g., bitcells in a bitcell array) having one or more reference paths. The memory structure may be disposed in a first area of an integrated circuit, and the logic structure may be disposed in a second area of the integrated circuit that is different than the first area. Also, the memory structure and the logic structure may be formed (or fabricated) at the same time on a single chip.

At block 620, method 600 may manage power distribution to the logic structure and to the memory structure by receiving a feedback signal from the logic structure and by using adaptive voltage scaling (AVS) to adaptively adjust voltage provided to the memory circuitry based on the feedback signal to affect performance of the memory structure. In some instances, the logic structure may provide the feedback signal based on the detected variation of performance of the memory structure, and performance of the memory structure may be based on operating conditions associated with the detected variation of the process, voltage and temperature (PVT) of the memory structure. The logic structure may be formed as a performance sensing logic structure.

At block 630, method 600 may implement a logic stage in the memory structure so as to reduce signal delay in the one or more reference paths for alignment with the adaptive voltage scaling (AVS). In some implementations, the method 600 may include coupling the logic stage to the reference path, and the logic stage may be implemented with a modified logic stage. The modified logic stage may increase the strength of transistors that are utilized for discharging a dummy bitline associated with the memory structure, and/or the modified logic stage may be used to reduce a number of stages in one or more buffers that are coupled between the dummy bitline (DBL) and the reset signal (RST) associated with the memory structure. The modified logic stage may reduce delay between the clock signal (CLK) and the dummy wordline (DWL) that is associated with the memory structure, and/or the modified logic stage may reduce a length of the dummy wordline (DWL) path that is associated with the memory structure.

Figure 7:
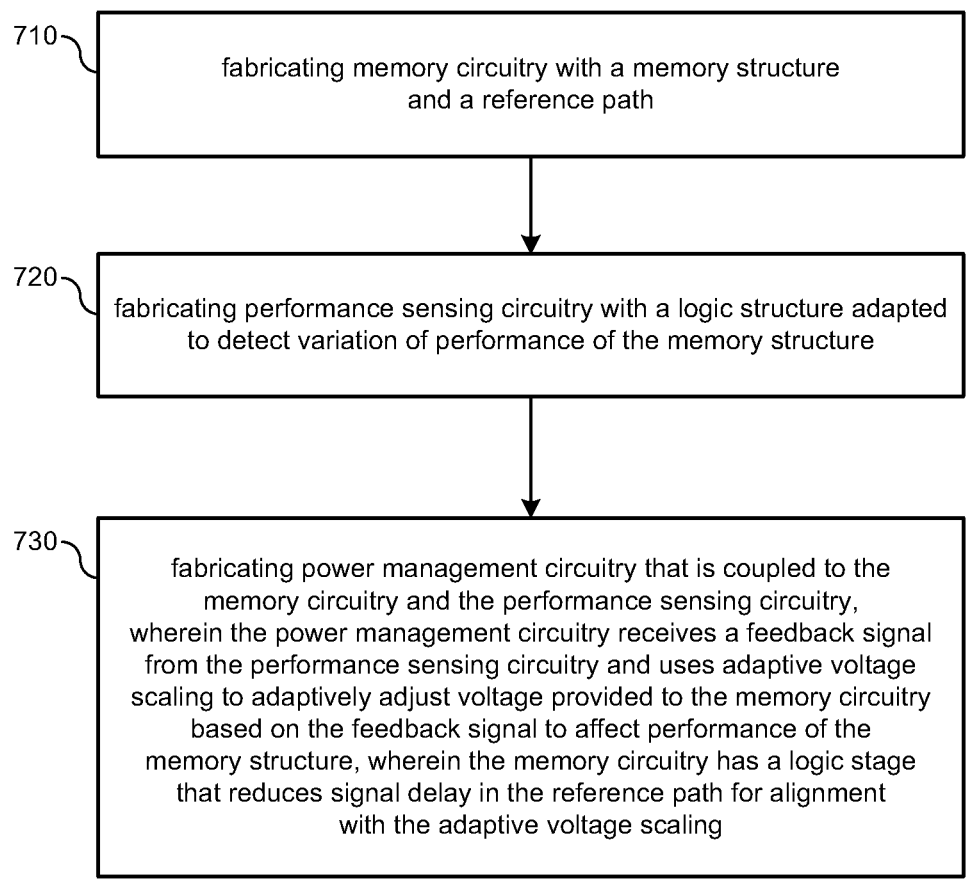
FIG. 7 illustrates a process flow diagram of a method for providing performance sensing circuitry in accordance with various implementations described herein.

FIG. 7 illustrates a process diagram of a method 700 for providing performance sensing circuitry in accordance with implementations described herein.

It should be understood that even though method 700 indicates a particular order of operation execution, in some cases, various certain portions of the operations may be executed in a different order, and on different systems. In other cases, additional operations and/or steps may be added to and/or omitted from method 700. Also, method 700 may be implemented in hardware and/or software. If implemented in hardware, the method 700 may be implemented with various components and/or circuitry, as described herein in reference to FIGS. 1-6. Also, if implemented in software, method 700 may be implemented as a program and/or software instruction process configured for providing performance sensing circuitry, as described herein above. Further, if implemented in software, instructions related to implementing the method 700 may be stored in memory and/or a database. For instance, a computer or various other types of computing devices having at least one processor and memory may be configured to perform method 700.

As described and shown in reference to FIG. 7, method 700 may be utilized for fabricating and/or manufacturing, or causing to be fabricated and/or manufactured, an integrated circuit (IC) that implements various memory performance managing schemes and techniques as described herein that are related to providing performance sensing circuitry and/or various associated devices, components and circuits.

At block 710, method 700 may fabricate memory circuitry with a memory structure with one or more reference paths. Also, at block 720, method 700 may fabricate performance sensing circuitry (or sensor circuitry) with a logic structure that is adapted to detect variation of performance of the memory structure. In addition, at block 730, method 700 may fabricate power management circuitry coupled to the memory circuitry and the performance sensing circuitry. In some instances, the power management circuitry may receive a feedback signal from the performance sensing circuitry and use adaptive voltage scaling (AVS) to adaptively adjust voltage provided to the memory circuitry based on the feedback signal so as to affect performance of the memory structure. The memory circuitry may include one or more logic stages that reduce signal delay in the one or more reference paths for alignment with the adaptive voltage scaling (AVS). Also, the memory circuitry and the performance sensing circuitry may be formed (or fabricated) at the same time on a single chip.

In some implementations, method 700 may include coupling the one or more logic stages to the one or more reference paths. The one or more logic stages may be used to increase the strength of transistors that are utilized for discharging a dummy bitline (DBL) associated with the memory structure. The one or more logic stages may be used to reduce a number of stages in a buffer (e.g., buffers 214, 224) that is coupled between a dummy bitline (DBL) and a reset signal (RST) associated with the memory structure. Also, in some instances, the one or more logic stages may be used to reduce the delay between the clock signal (CLK) and the dummy wordline (DWL) associated with the memory structure. Also, the one or more logic stages may be used to reduce a length of the dummy wordline (DWL) path associated with the memory structure.

Described herein are various implementations of an integrated circuit. The integrated circuit may include memory circuitry having a memory structure with a reference path. The integrated circuit may include performance sensing circuitry having a logic structure adapted to detect variation of performance of the memory structure. The integrated circuit may include power management circuitry that is coupled to the memory circuitry and the performance sensing circuitry. The power management circuitry may receive a feedback signal from the performance sensing circuitry and adaptively adjust voltage provided to the memory circuitry based on the feedback signal to thereby affect performance of the memory structure. The memory circuitry may include a logic stage that reduces signal delay in the reference path for alignment with the adaptively adjusted voltage.

Described herein are various implementations of a method. The method may include sensing operational characteristics of a logic structure that is adapted for detecting variation of performance of a memory structure having a reference path. The method may include managing power distribution to the logic structure and to the memory structure by receiving a feedback signal from the logic structure and by adaptively adjusting voltage provided to the memory circuitry based on the feedback signal to affect performance of the memory structure. The method may include implementing a logic stage in the memory structure to reduce signal delay in the reference path for alignment with the adaptively adjusted voltage.

Described herein are various implementations of a method. The method may include fabricating memory circuitry with a memory structure and a reference path. The method may include fabricating performance sensing circuitry with a logic structure that is adapted to detect variation of performance of the memory structure. The method may include fabricating power management circuitry that is coupled to the memory circuitry and the performance sensing circuitry. The power management circuitry may receive a feedback signal from the performance sensing circuitry and adaptively adjust voltage provided to the memory circuitry based on the feedback signal to affect performance of the memory structure. The memory circuitry may have a logic stage that reduces signal delay in the reference path for alignment with the adaptively adjusted voltage.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
    memory circuitry having a memory structure with a reference path;
    performance sensing circuitry having a logic structure adapted to detect variation of performance of the memory structure; and
    power management circuitry coupled to the memory circuitry and the performance sensing circuitry, wherein the power management circuitry receives a feedback signal from the performance sensing circuitry and adaptively adjusts voltage provided to the memory circuitry based on the feedback signal to affect performance of the memory structure, and
    wherein the memory circuitry has a logic stage that reduces signal delay in the reference path for alignment with the adaptively adjusted voltage.

2. The integrated circuit of claim 1, wherein the power management circuitry uses adaptive voltage scaling (AVS) to adaptively adjust voltage provided to the memory circuitry based on the feedback signal to affect performance of the memory structure, and wherein the memory circuitry uses the logic stage to reduce signal delay in the reference path for alignment with the adaptive voltage scaling (AVS).

3. The integrated circuit of claim 1, wherein the logic structure provides the feedback signal to the power management circuitry based on the detected variation of performance of the memory structure.

4. The integrated circuit of claim 1, wherein the memory structure is disposed in a first area of the integrated circuit, and wherein the logic structure is disposed in a second area of the integrated circuit that is different than the first area, and wherein performance of the memory structure is based on one or more operating conditions associated with a detected variation of at least one of process, voltage and temperature of the memory structure.

5. The integrated circuit of claim 1, wherein the memory structure is a first memory structure having first memory cells, and wherein the logic structure is a second memory structure having second memory cells that are separate from the first memory cells.

6. The integrated circuit of claim 1, wherein memory circuitry comprises self-timed static random access memory (SRAM), and wherein the memory structure comprises an array of SRAM bitcells.

7. The integrated circuit of claim 1, wherein the logic stage comprises a modified logic stage that is coupled to the reference path.

8. The integrated circuit of claim 7, wherein:
    the modified logic stage reduces a number of stages in a buffer coupled between a dummy bitline and a reset signal associated with the memory structure, or
    the modified logic stage increases strength of transistors that are used for discharging a dummy bitline associated with the memory structure.

9. The integrated circuit of claim 7, wherein:
    the modified logic stage reduces a delay between a clock signal and a dummy wordline associated with the memory structure, or
    the modified logic stage reduces a length of the dummy wordline path associated with the memory structure.

10. The integrated circuit of claim 1, wherein the memory circuitry and the performance sensing circuitry are fabricated on a single chip.

11. A method, comprising:
    sensing operational characteristics of a logic structure that is adapted for detecting variation of performance of a memory structure having a reference path;
    managing power distribution to the logic structure and to the memory structure by receiving a feedback signal from the logic structure and by adaptively adjusting voltage provided to the memory circuitry based on the feedback signal to affect performance of the memory structure; and implementing a logic stage in the memory structure to reduce signal delay in the reference path for alignment with the adaptively adjusted voltage.

12. The method of claim 11, wherein managing power distribution to the logic structure and to the memory structure includes using adaptive voltage scaling (AVS) to adaptively adjust voltage provided to the memory circuitry based on the feedback signal to affect performance of the memory structure, and wherein implementing the logic stage in the memory structure reduces signal delay in the reference path for alignment with the adaptive voltage scaling (AVS).

13. The method of claim 11, wherein the logic structure provides the feedback signal based on the detected variation of performance of the memory structure, and wherein performance of the memory structure is based on operating conditions associated with a detected variation of process, voltage and temperature of the memory structure.

14. The method of claim 11, further comprising:
coupling the logic stage to the reference path, wherein the logic stage comprises a modified logic stage.

15. The method of claim 14, wherein:
the modified logic stage increases strength of transistors that are utilized for discharging a dummy bitline associated with the memory structure, or
the modified logic stage reduces a number of stages in a buffer coupled between a dummy bitline and a reset signal associated with the memory structure.

16. The method of claim 14, wherein:
the modified logic stage reduces a delay between a clock signal and dummy wordline associated with the memory structure, or
the modified logic stage reduces a length of the dummy wordline path associated with the memory structure.

17. The method of claim 11, wherein the memory structure is disposed in a first area of an integrated circuit, and wherein the logic structure is disposed in a second area of the integrated circuit that is different than the first area, wherein the logic structure comprises a performance sensing logic structure, and wherein the memory structure and the performance sensing logic structure are fabricated on a single chip.

18. A method, comprising:
fabricating memory circuitry with a memory structure and a reference path;
fabricating performance sensing circuitry with a logic structure adapted to detect variation of performance of the memory structure; and
fabricating power management circuitry that is coupled to the memory circuitry and the performance sensing circuitry, wherein the power management circuitry receives a feedback signal from the performance sensing circuitry and adaptively adjusts voltage provided to the memory circuitry based on the feedback signal to affect performance of the memory structure, and
wherein the memory circuitry has a logic stage that reduces signal delay in the reference path for alignment with the adaptively adjusted voltage.

19. The method of claim 18, further comprising:
coupling the logic stage to the reference path,
wherein the logic stage increases strength of transistors that are utilized for discharging a dummy bitline associated with the memory structure, and
wherein the logic stage reduces a number of stages in a buffer coupled between a dummy bitline and a reset signal associated with the memory structure.

20. The method of claim 18, further comprising:
coupling the logic stage to the reference path,
wherein the logic stage reduces a delay between a clock signal and dummy wordline associated with the memory structure, and
wherein the logic stage reduces a length of the dummy wordline path associated with the memory structure.

* * * * *